United States Patent
Xie et al.

(10) Patent No.: US 8,929,062 B2
(45) Date of Patent: Jan. 6, 2015

(54) WIRELESS TERMINAL DEVICE

(75) Inventors: Yanping Xie, Shenzhen (CN); Qing Liu, Shenzhen (CN); Ping Lei, Shenzhen (CN); Yao Lan, Shenzhen (CN); Shuhui Sun, Shenzhen (CN)

(73) Assignee: Huawei Device Co., Ltd., Shenzhen (CN)

( * ) Notice: Subject to any disclaimer, the term of this patent is extended or adjusted under 35 U.S.C. 154(b) by 279 days.

(21) Appl. No.: 13/422,281

(22) Filed: Mar. 16, 2012

(65) Prior Publication Data

US 2012/0176750 A1  Jul. 12, 2012

Related U.S. Application Data

(63) Continuation of application No. PCT/CN2010/076481, filed on Aug. 31, 2010.

(30) Foreign Application Priority Data

Sep. 18, 2009  (CN) .......................... 2009 1 0093387

(51) Int. Cl.
| | | |
|---|---|---|
| *G06F 1/16* | (2006.01) | |
| *H05K 1/14* | (2006.01) | |
| *H05K 5/00* | (2006.01) | |
| *H05K 7/00* | (2006.01) | |
| *H05K 1/02* | (2006.01) | |

(52) U.S. Cl.
CPC ............. *H05K 1/14* (2013.01); *H05K 1/0215* (2013.01); *H05K 2201/0311* (2013.01)
USPC ................. 361/679.31; 361/679.32; 361/736; 361/760; 361/785

(58) Field of Classification Search
USPC ............. 361/679.31, 679.32, 679.33, 679.37, 361/734, 736, 751, 760, 762, 767, 769, 771, 361/772, 776, 779, 785, 791, 684, 799; 710/306, 313
See application file for complete search history.

(56) References Cited

U.S. PATENT DOCUMENTS

| | | | |
|---|---|---|---|
| 7,095,617 B1 * | 8/2006 | Ni ................................. | 361/736 |
| 7,375,975 B1 * | 5/2008 | Jang et al. ..................... | 361/752 |
| 7,510,420 B2 | 3/2009 | Mori | |
| 7,530,823 B1 | 5/2009 | Thornton et al. | |
| 7,695,311 B2 * | 4/2010 | Nemoto ........................ | 439/495 |

(Continued)

FOREIGN PATENT DOCUMENTS

| | | |
|---|---|---|
| CN | 1318213 | 10/2001 |
| CN | 200976585 | 11/2007 |
| CN | 101674674 | 3/2010 |
| EP | 2096724 A1 | 9/2009 |

(Continued)

OTHER PUBLICATIONS

Foreign Communication From a Counterpart Application, Chinese Application 200910093387.9, Chinese Search Report dated Sep. 18, 2009, 2 pages.

(Continued)

*Primary Examiner* — Hoa C Nguyen
*Assistant Examiner* — Binh Tran
(74) *Attorney, Agent, or Firm* — Conley Rose, P.C.; Grant Rodolph; Nicholas K. Beaulieu

(57) ABSTRACT

A wireless terminal device includes: a conduction and connection module, and a first Printed Circuit Board, PCB, connected to the conduction and connection module, and the wireless terminal device further includes a first conductor, where one of the conduction and connection module and the first PCB is connected to one end of the first conductor through a first capacitance coupling module, and the other one of the conduction and connection module and the first PCB is connected to the other end of the first conductor. Through the foregoing processing, capacitance coupling and grounding between the conduction and connection module and the PCB can be implemented through the first capacitance coupling module.

21 Claims, 3 Drawing Sheets

(56) References Cited

U.S. PATENT DOCUMENTS

| | | | |
|---|---|---|---|
| 2006/0094301 A1 | 5/2006 | Lee et al. | |
| 2007/0102830 A1* | 5/2007 | Muto et al. | 257/784 |
| 2008/0194119 A1 | 8/2008 | Mori et al. | |
| 2010/0273341 A1* | 10/2010 | Shen | 439/329 |
| 2010/0285851 A1* | 11/2010 | Horihata et al. | 455/575.3 |

FOREIGN PATENT DOCUMENTS

| | | |
|---|---|---|
| JP | 2006128061 A | 5/2006 |
| JP | 2006134734 A | 5/2006 |
| JP | 2009171045 A | 7/2009 |
| WO | 2007024409 A1 | 3/2007 |
| WO | WO 2011/032460 | 3/2011 |

OTHER PUBLICATIONS

Written Opinion of the International Searching Authority, issued in related Chinese Patent Application No. PCT/CN2010/076481; dated (mailed) Dec. 9, 2010; Huawei Tech Co., Ltd. et al., (5 pgs.).

Second Chinese Office Action (Translation), dated (mailed) Apr. 6, 2012; issued in related Chinese Application No. 200910093387.9 (Chinese version attached) (5 pgs.)

Foreign Communication From a Counterpart Application, European Application No. 10816664.6, Extended European Search Report dated Aug. 5, 2013, 7 pages.

International Search Report mailed Dec. 9, 2010, for International Patent Application No. PCT/CN2010/076481.

Guo,Hao et al.: "PCB Design for High-Rate USB 2.0' Device Microcontrollers & Embedded Systems", No. 5, May 2006.

Foreign Communication From a Counterpart Application, Japanese Application No. 2012-529106, Japanese Office Action dated Aug. 13, 2013, 3 pages.

Foreign Communication From a Counterpart Application, Japanese Application No. 2012-529106, English Translation for Japanese Office Action dated Aug. 13, 2013, 2 pages.

* cited by examiner

WIRELESS TERMINAL DEVICE

CROSS-REFERENCE TO RELATED APPLICATIONS

This application is a continuation of International Application No. PCT/CN2010/076481, filed on Aug. 31, 2010, which claims priority to Chinese Patent Application No. 200910093387.9, filed on Sep. 18, 2009, both of which are hereby incorporated by reference in their entireties.

FIELD OF THE INVENTION

The present invention relates to the field of wireless communications technologies, and in particular, to a wireless terminal device.

BACKGROUND OF THE INVENTION

With the development of wireless communications technologies, various types of wireless terminal devices become more and more popular. The wireless terminal device may be connected to other devices through a universal serial bus (Universal Serial Bus, USB for short) converter apparatus, which is also referred to as a USB converter, so as to implement more applications. For example, a wireless network card of the wireless terminal device may be connected to a notebook computer through the USB converter to implement access to a wireless network through the notebook computer. Alternatively, the wireless network card of the wireless terminal device is connected to an access point (Access Point, AP for short) of Wireless Fidelity (Wireless Fidelity, WIFI for short) through the USB converter to implement access of multiple users to the wireless network.

A mainstream application in the various applications of the conventional USB converter is to connect the wireless network card to the notebook computer to access the wireless network. In the prior art, the wireless network card may be connected to the notebook computer in a fixed USB converter manner, a movable USB converter manner and a rotary USB converter manner.

In the rotary USB manner, since the USB adopts a double grounding manner, it is required to lead out two grounding wires respectively from two ends of the USB converter. As shown in FIG. 1, one grounding wire is a metal conductive layer sleeved outside four signal lines, and the other grounding wire is a grounding spring plate, where the grounding spring plate may not be connected to the USB and a PCB through welding, but is in contact with the USB and the PCB through crimping, and an impedance of a contact point between the grounding spring plate and the USB and that of a contact point between the grounding spring plate and the PCB need to be below 2 ohms during the use of the grounding spring plate. However, based on the above structure, if the grounding spring plate is not fully crimped with the USB and the PCB, the impedance is possibly increased.

SUMMARY OF THE INVENTION

Embodiments of the present invention provide a wireless terminal device, so as to implement capacitance coupling and grounding between a conduction and connection module and a first printed circuit board.

An embodiment of the present invention provides a wireless terminal device, which includes a conduction and connection module, and a first printed circuit board, PCB, connected to the conduction and connection module, and further includes a first conductor, where one of the conduction and connection module and the first PCB is connected to one end of the first conductor through a first capacitance coupling module, and the other one of the conduction and connection module and the first PCB is connected to the other end of the first conductor.

The wireless terminal device according to the embodiments of the present invention provides a new grounding manner of the conduction and connection module and the PCB, which can implement capacitance coupling and grounding between the conduction and connection module and the PCB through the first capacitance coupling module.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

The technical solutions of the embodiments of the present invention are further illustrated in the following with reference to the accompanying drawings and specific embodiments.

According to an embodiment of the present invention, a wireless terminal device is provided, including a conduction and connection module, a first PCB connected to the conduction and connection module, and a first conductor. In the wireless terminal device according to the embodiment of the present invention, one of the conduction and connection module and the first PCB is connected to one end of the first conductor through a first capacitance coupling module, and the other one of the conduction and connection module and the first PCB is connected to the other end of the first conductor. The conduction and connection module and the first PCB may be connected in two ways.

First, the conduction and connection module is connected to one end of the first conductor through the first capacitance coupling module, and the first PCB is connected to the other end of the first conductor.

Alternatively, the first PCB is connected to one end of the first conductor through the first capacitance coupling module, and the conduction and connection module is connected to the other end of the first conductor.

The conduction and connection module or the first PCB may be connected to the end of the first conductor through a second capacitance coupling module; alternatively, the conduction and connection module or the first PCB is directly connected to the other end of the first conductor.

In addition, in the embodiment of the present invention, the first capacitance coupling module may be a first insulation material medium or a first lumped capacitance component, and the second capacitance coupling module may be a second insulation material medium or a second lumped capacitance component.

The wireless terminal device under various conditions is illustrated in detail in the following with reference to the accompanying drawings.

Figure 1:
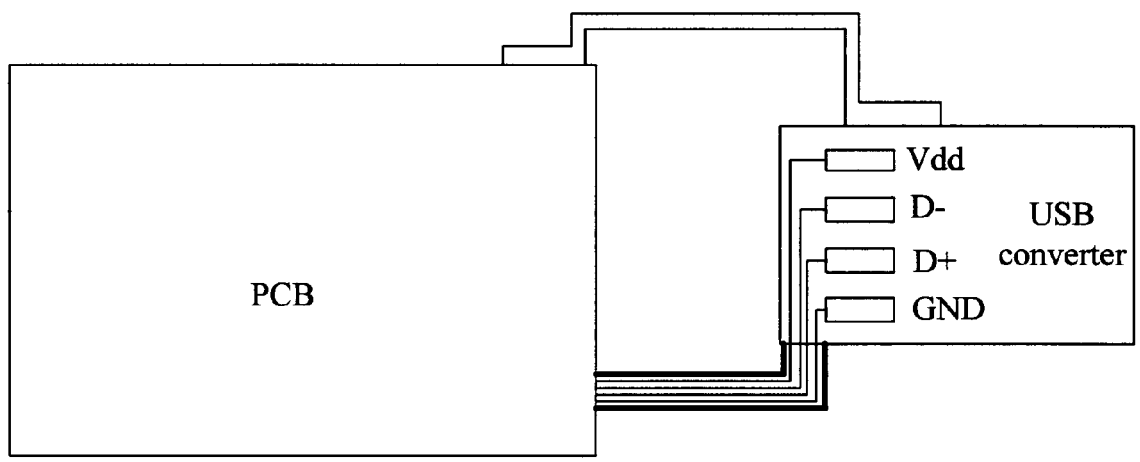
FIG. 1 is a schematic structural diagram of a rotary USB converter in the prior art.
Figure 2:
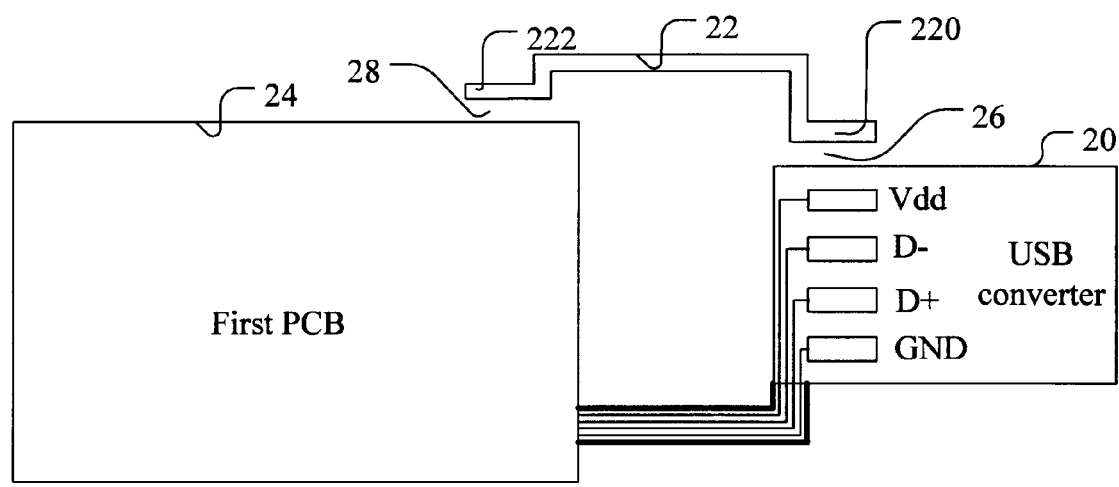
FIG. 2 is a schematic diagram of a wireless terminal device according to a first embodiment of the present invention.

FIG. 2 is a schematic diagram of a wireless terminal device according to a first embodiment of the present invention. As shown in FIG. 2, the wireless terminal device according to the embodiment of the present invention includes a conduction and connection module and a first conductor 22. The wireless terminal device according to the embodiment of the present invention may be a mobile phone or a wireless network card. When the wireless terminal is a mobile phone, the conduction and connection module may be a second PCB; and when the wireless terminal is a wireless network card, the conduction and connection module may be a USB converter 20. For example, the embodiment of the present invention is described through the example that the conduction and connection module is a USB converter 20.

Specifically, a power supply line Vdd, a ground line GDN, and a differential signal line D+/− are disposed in the USB converter 20, where the differential signal lines include a positive differential signal line D+ and a negative differential signal line D−. The above four signal lines in the USB converter 20 are respectively and correspondingly connected to a power supply line Vdd, a ground line GDN, and a differential signal line D+/− on a first PCB 24. That is, the power supply line Vdd in the USB converter 20 is connected to the power supply line Vdd on the first PCB 24, the ground line GDN in the USB converter 20 is connected to the ground line GDN on the first PCB 24, the positive differential signal line D+ in the USB converter 20 is connected to the positive differential signal line D+ on the first PCB 24, and the negative differential signal line D− in the USB converter 20 is connected to the negative differential signal line D− on the first PCB 24, so as to form a wire body. The wire body may be separately wrapped by an insulation material, and a metal conductive layer for shielding and grounding is sleeved outside the wire body after the wrapping by the insulation material, where two ends of the metal conductive layer are respectively connected to the USB converter 20 and the first PCB 24, so that the wire body is shielded and grounded. The above manner may be implemented through a USB line structure or a flexible printed circuit (Flexible Printed Circuit, FPC for short) structure.

As shown in FIG. 2, a converter apparatus according to the embodiment of the present invention includes a first conductor 22, where one end of the first conductor 22 is connected to the USB converter 20 through a first insulation material medium 26, and further the first insulation material medium 26 is disposed between one end of the first conductor 22 and a metal layer at an outer side of the USB converter 20. Since one end of the first conductor 22 is not directly connected to the USB converter 20, the connection in the foregoing manner is also referred to as a virtual connection. In this way, a capacitor structure can be formed at the virtual connection of the first conductor 22 and the USB converter 20. In addition, the first insulation material medium 26 also serves a function of fixing the first conductor 22 onto the USB converter 20. In applications, a first lumped capacitance component may also be used to replace the first insulation material medium 26, where the use of the first lumped capacitance component may achieve the same effect as the use of the first insulation material medium 26 does, that is, to form a capacitance coupling effect. In the embodiment of the present invention, the first conductor 22 may be a metal spring plate. As shown in FIG. 2, two spring feet are disposed at two ends of the metal spring plate, and are respectively a first spring foot 220 and a second spring foot 222, where the first spring foot 220 is virtually connected to the USB converter 20. A second insulation material medium 28 for connecting the first PCB 24 is disposed at the other end of the first conductor 22, that is to say, the second spring foot 222 of the metal spring plate is virtually connected to a spacing between the circuit boards on the first PCB 24 through the second insulation material medium 28, so that a capacitor structure is formed at the virtual connection of the second spring foot 222 of the metal spring plate and the first PCB 24, which implements the capacitance coupling effect between the first PCB 24 and the first conductor 22. In applications, a second lumped capacitance component may also be used to replace the second insulation material medium 28 to achieve the same effect as the use of the second insulation material medium 28 does.

Through the above processing, compared with the double grounding rotary USB converter manner, in the wireless terminal device according to the embodiment of the present invention, the USB converter is connected to the first PCB 24 in a capacitance coupling manner, which avoids the problem that the impedance is increased because the first conductor 22 is not fully crimped with the USB converter 20 and the first PCB 24.

Since the first conductor is connected to the USB converter or the PCB through the insulation medium i.e., a virtual connection, and a capacitance is formed at the virtual connection, the USB converter is connected to the PCB in the capacitance coupling manner, which avoids the control of the resistance at a contact point of the grounding wire and the wireless network card PCB, and thereby facilitates the production and improves the qualification rate of the products. In addition, since the USB converter is connected to the PCB in the capacitance coupling manner in the embodiment of the present invention, a specific absorption rate (Specific Absorption Rate, SAR for short) of electromagnetic waves in the double grounding rotary USB converter manner is improved in a certain level.

Figure 3:
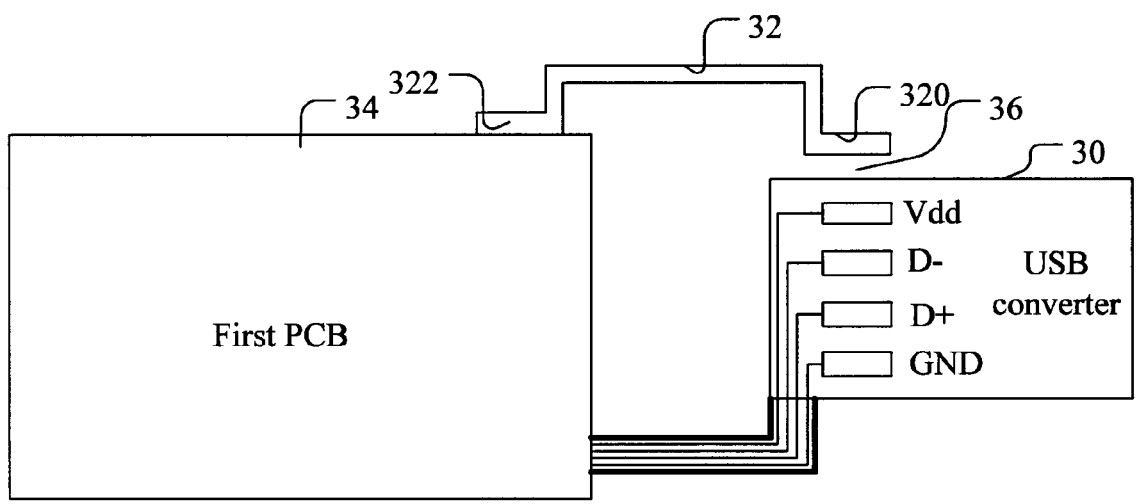
FIG. 3 is a schematic diagram of a wireless terminal device according to a second embodiment of the present invention.

According to an embodiment of the present invention, a wireless terminal device is provided, and FIG. 3 is a schematic diagram of the wireless terminal device according to a second embodiment of the present invention. As shown in FIG. 3, the wireless terminal device according to the embodiment of the present invention includes a conduction and connection module and a first conductor 32. The wireless terminal device according to the embodiment of the present invention may be a mobile phone or a wireless network card. When the wireless terminal is a mobile phone, the conduction and connection module may be a second PCB; and when the wireless terminal is a wireless network card, the conduction and connection module may be a USB converter 30. The following embodiment of the present invention is described through the example that the conduction and connection module is the USB converter 30.

Specifically, a power supply line Vdd, a ground line GDN, and a differential signal line D+/− are disposed in the USB converter 30, where the differential signal lines include a positive differential signal line D+ and a negative differential signal line D−, and the above four signal lines in the USB converter 30 are respectively and correspondingly connected to a power supply line Vdd, a ground line GDN, and a differential signal line D+/− on a first PCB 34 in the wireless terminal device to form a wire body. The wire body needs to be separately wrapped by an insulation material, and a metal conductive layer for shielding and grounding is sleeved outside the wire body after the wrapping of the insulation material, where two ends of the metal conductive layer are respectively connected to the USB converter 30 and the first PCB 34, so that the wire body is shielded and grounded. In applications, the above manner may be implemented through a USB line structure or an FPC structure.

As shown in FIG. 3, a converter apparatus according to the embodiment of the present invention includes a first conductor 32, where one end of the first conductor 32 is connected to the USB converter 30 through a first insulation material medium 36, and further the first insulation material medium 36 is disposed between one end of the first conductor 32 and a metal layer at an outer side of the USB converter 30. Since one end of the first conductor 32 is not directly connected to the USB converter 30, the connection in the foregoing manner is also referred to as a virtual connection. In this way, a capacitor structure is formed at a virtual connection of the first conductor 32 and the USB converter 30. In addition, the first insulation material medium 36 also serves a function of fixing the first conductor 32 onto the USB converter 30. In applications, a first lumped capacitance component may also be used to replace the first insulation material medium 36 to achieve the same effect as the use of the first insulation material medium 36 does, that is, to form a capacitance coupling effect. In the embodiment of the present invention, the first conductor 32 may be a metal spring plate. As shown in FIG. 3, two spring feet are disposed at two ends of the metal spring plate, and are respectively a first spring foot 320 and a second spring foot 322, where the first spring foot 320 is virtually connected to the USB converter 30, and the second spring feet 322 is directly connected to the first PCB 34.

Through the above processing, compared with the double grounding rotary USB converter manner, the wireless terminal device according to the embodiment of the present invention has one end connected to the USB converter in the capacitance coupling manner, and the other end is directly connected to the PCB. Since one end is connected to the USB converter in the capacitance coupling manner, the problem that the impedance is increased because the first conductor 32 is not fully crimped with the USB converter 30 and the first PCB 34 is avoided.

According to one embodiment of the present invention, one end of the wireless terminal device is connected to the USB converter in the capacitance coupling manner, which avoids controlling the resistance on a contact point of the grounding wire and the wireless network card PCB, and thereby facilitates the production, and improves the qualification rate of the products.

Figure 4:
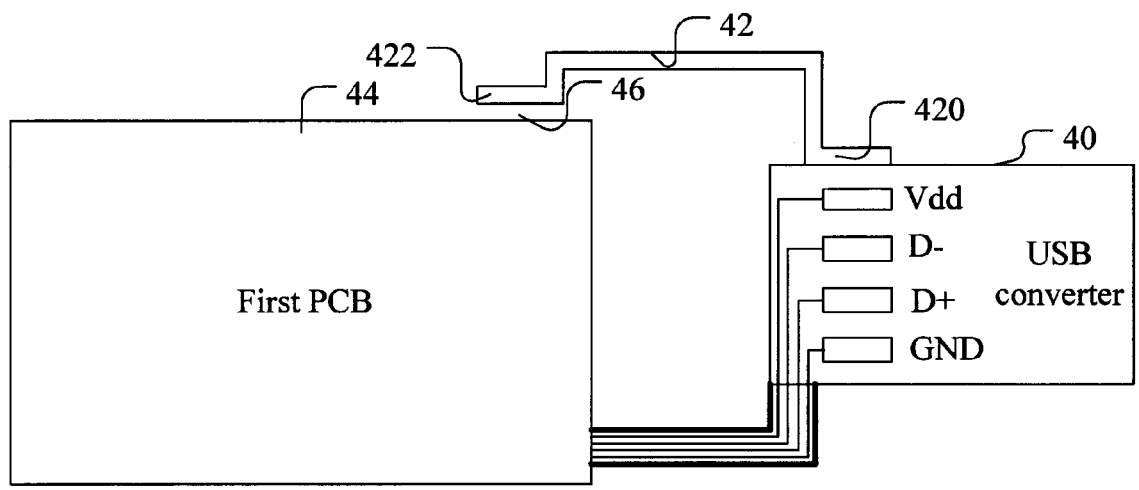
FIG. 4 is a schematic diagram of a wireless terminal device according to a third embodiment of the present invention.

An embodiment of the present invention provides a wireless terminal device, and FIG. 4 is a schematic diagram of the wireless terminal device according to a third embodiment of the present invention. As shown in FIG. 4, a converter apparatus according to the embodiment of the present invention includes a conduction and connection module and a first conductor 42. The wireless terminal device according to an embodiment of the present invention may be a mobile phone or a wireless network card. When the wireless terminal is a mobile phone, the conduction and connection module may be a second PCB; and when the wireless terminal is a wireless network card, the conduction and connection module may be a USB converter 40. The following embodiment of the present invention is described through the example that the conduction and connection module is the USB converter 40.

Specifically, a power supply line Vdd, a ground line GDN, and a differential signal line D+/− are disposed in the USB converter 40, where the differential signal line includes a positive differential signal line D+ and a negative differential signal line D−, and the above four signal lines in the USB converter 40 are respectively and correspondingly connected to a power supply line Vdd, a ground line GDN, and a differential signal line D+/− on a first PCB 44 in the wireless terminal device to form a wire body. The wire body needs to be separately wrapped by an insulation material, and a metal conductive layer for shielding and grounding is sleeved outside the wire body after the wrapping of the insulation material, where two ends of the metal conductive layer are respectively connected to the USB converter 40 and the first PCB 44, so that the wire body is shielded and grounded. In applications, the above manner may be implemented through a USB line structure or an FPC structure.

As shown in FIG. 4, a converter apparatus according to the embodiment of the present invention includes a first conductor 42, where one end of the first conductor 42 is directly connected to the USB converter 40. In the embodiment of the present invention, the first conductor 42 may be a metal spring plate. As shown in FIG. 4, two spring feet are disposed at two ends of the metal spring plate, and are respectively a first spring foot 420 and a second spring foot 422, where the first spring foot 420 is directly connected to the USB converter 40, and the second spring feet 422 of the first conductor 42 is connected to the first PCB 44 through a second insulation material medium 46, that is, the other end of the first conductor 42 is virtually connected to the first PCB 44. A second insulation material medium 46 needs to be filled at a virtual connection of the first conductor 42 and the first PCB 44, so that a capacitor structure may form at the virtual connection of the first conductor 42 and the first PCB 44. In addition, the second insulation material medium 46 also fixes the first conductor 42 onto the first PCB 44. In actual applications, a second lumped capacitance component may also be used to replace the second insulation material medium 46 to achieve the same effect as the use of the second insulation material medium 46 does.

Through the above processing, compared with the double grounding rotary USB converter manner, the wireless terminal device according to the embodiment of the present invention has one end connected to the USB converter in the capacitance coupling manner, and the other end is directly connected to the PCB. Since one end is connected to the USB converter in the capacitance coupling manner, the problem that the impedance is increased because the first conductor 42 is not fully crimped with the USB converter 40 and the first PCB 44 is avoided.

According to one embodiment of the present invention, one end of the wireless terminal device is connected to the USB converter 40 in the capacitance coupling manner, the other end is directly connected to the PCB. Since one end is connected to the USB converter 40 in the capacitance coupling manner, the control of the resistance at a contact point of the grounding wire and the wireless network card PCB is avoided, the production is facilitated, and the qualification rate of the products is improved.

Figure 5:
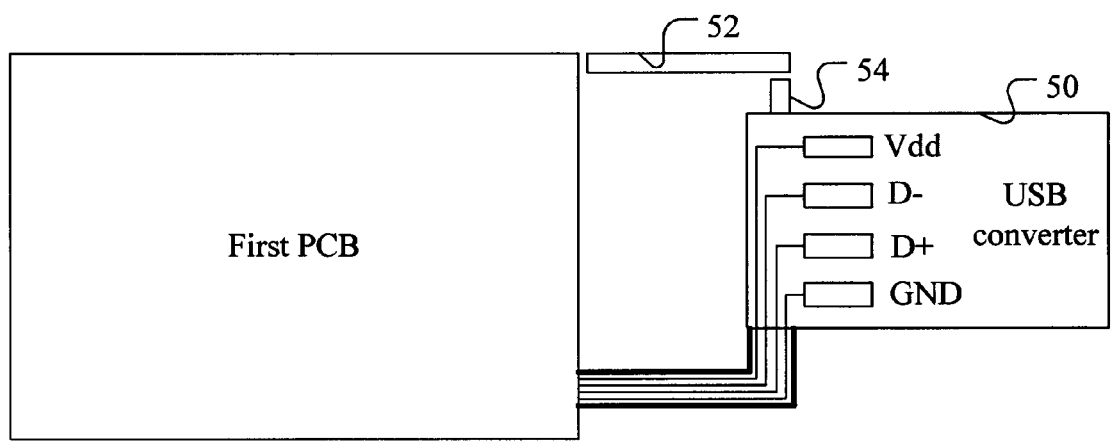
FIG. 5 is a schematic diagram of a wireless terminal device according to a fourth embodiment of the present invention.

An embodiment of the present invention provides a wireless terminal device, and FIG. 5 is a schematic diagram of the wireless terminal device according to a fourth embodiment of the present invention. As shown in FIG. 5, the wireless terminal device according to the embodiment of the present invention includes a conduction and connection module, a first conductor 52, and a second conductor 54. The wireless terminal device according to the embodiment of the present invention may be a mobile phone or a wireless network card. When the wireless terminal is a mobile phone, the conduction and connection module may be a second PCB; and when the wireless terminal is a wireless network card, the conduction and connection module may be a USB converter 50. the following embodiment of the present invention is described through the example that the conduction and connection module is the USB converter 50.

In the wireless terminal device according to the embodiment of the present invention, a second conductor 54 disposed between the first conductor 52 and the USB converter 50 is added in the converter apparatuses in the first embodiment to the third embodiment, where one end of the second conductor 54 is connected to the USB converter 50, and the other end of the second conductor 54 is connected to the other end of the first conductor 52 directly or through a second capacitance coupling module. Specifically, in the case that one end of the first conductor 52 is connected to the first PCB through a first capacitance coupling module, the other end of the second conductor 54 is connected to the other end of the first conductor 52 through a second capacitance coupling module or directly; and in the case that one end of the first conductor 52 is directly connected to the first PCB, the other end of the second conductor 54 is connected to the other end of the first conductor 52 through the second capacitance coupling module.

It should be noted that, FIG. 5 merely illustrates the case of adding the second conductor 54 in the first embodiment, and reference may be made to FIG. 5 for the case of adding the second conductors 54 in the second embodiment and the third embodiment. As shown in FIG. 5, the USB converter 50 is disposed on one end of the second conductor 54, and in the first embodiment and the second embodiment, the other end of the second conductor 54 is connected to the other end of the first conductor 52 through a second insulation material medium. In the third embodiment, the other end of the second conductor 54 is directly connected to the other end of the first conductor 52. Reference may be made to the foregoing embodiments for the description of other modules in the wireless terminal device, and the details thereof are not described herein again.

Through the foregoing processing, since the second conductor 54 is added, the first conductor 52 may be connected or virtually connected to the USB converter 50 through the second conductor 54, which optimizes the contact between the first conductor 52 and the USB converter 50.

According to an embodiment of the present invention, the conduction and connection module may also be a second PCB, and the implementation principle thereof is similar to the USB converter, which is not described in detail herein again.

It can be understood that, the wireless network card in the foregoing embodiment may be a data card.

It should be noted that, in all the embodiments, the materials of the first conductor and the second conductor may be the same or different, and similarly, the materials of the first insulation material medium and the second insulation material medium may be the same or different. In addition, the first lumped capacitance component may be used to replace the first insulation material medium, and/or the second lumped capacitance component may be used to replace the second insulation material medium. In actual applications, the selection may be made according to requirements in actual conditions.

The wireless terminal device according to the embodiment of the present invention is a small wireless terminal device such as a wireless network card, that is, the conduction and connection module is the USB converter. Since wireless performance is an important index for measuring the performance of the wireless network card, the effect of the connection between the wireless network card and the computer has a great influence on the wireless performance. In the embodiments of the present invention, the technical solutions of capacitance coupling and double ground are used, which may achieve the effect of a reliable connection between ground level of the wireless network card circuit and that of the computer, thereby improving the wireless performance of the wireless network card and reducing an SAR value at the same time. It should be noted that, the technical solutions according to the embodiments of the present invention may be used in a scenario that the USB converter in the small wireless terminal device need to be grounded with the PCB.

In addition, the wireless terminal device according to the embodiments of the present invention may also be a flip phone, that is, the conduction and connection module may be the first PCB, and is applicable to an application scenario that each two of all the PCBs need to be grounded.

The apparatus embodiments are merely exemplary. Units described as separate components may be or may not be physically separated. Components shown as units may be or may not be physical units, that is, may be integrated in one location or distributed to a number of network units. Some or all of the modules may be selected to achieve the objective of the solution in the embodiment according to actual demands. Persons of ordinary skill in the art can understand and implement the present invention without creative efforts.

Finally, it should be noted that the above embodiments are merely provided for describing the technical solutions of the present invention, but not intended to limit the present invention. It should be understood by persons of ordinary skill in the art that although the present invention has been described in detail with reference to the embodiments, modifications can be made to the technical solutions described in the embodiments, or equivalent replacements can be made to some technical features in the technical solutions; and such modifications or replacements do not made the essence of the corresponding technical solutions depart from the spirit and scope of the technical solutions in the embodiments of the present invention.

The invention claimed is:

1. A wireless terminal device, comprising:
   a conduction and connection module comprising a first power supply line connection point, a first ground line connection point, a first positive differential signal connection point, and a first negative differential signal connection point;
   a first Printed Circuit Board (PCB) comprising a second power supply line connection point, a second ground line connection point, a second positive differential signal connection point, and a second negative differential signal connection point;
   a wire body comprising four signal lines that connect the conduction and connection module and the first PCB, wherein one of the four signal lines connects the first power supply line connection point to the second power supply line connection point, wherein a second one of the four signal lines connects the first ground line connection point to the second ground line connection point, wherein a third one of the four signal lines connects the first positive differential signal connection point to the second positive differential signal connection point, and wherein a fourth one of the four signal lines connects the first negative differential signal connection point to the second negative differential signal connection point; and
   a metal spring plate comprising a first foot and a second foot, wherein the first foot of the metal spring plate is connected to the first PCB through a first insulation material medium to create a capacitance coupling effect between the first PCB and the metal spring plate, and wherein the second foot of the metal spring plate is connected to the conduction and connection module through a second insulation material medium to create a capacitance coupling effect between the conduction and connection module and the metal spring plate.

2. The wireless terminal device according to claim 1, wherein the first insulation material medium comprises a first lumped capacitance component, and wherein the second insulation material medium comprises a second lumped capacitance component.

3. The wireless terminal device according to claim 1, wherein the wireless terminal device is a wireless network card, and wherein the conduction and connection module is a Universal Serial Bus (USB) converter.

4. The wireless terminal device according to claim 1, wherein the wireless terminal device is a mobile phone, and wherein the conduction and connection module is a second PCB.

5. The wireless terminal device according to claim 1, wherein the metal spring comprises a first conductor and a second conductor, wherein the first conductor comprises a first end and a second end, wherein the second conductor comprises a first end and a second end, wherein the first end of the first conductor comprises the first foot, and wherein the first end of the second conductor comprises the second foot.

6. The wireless terminal device according to claim 5, wherein the second end of the first conductor is connected through a third insulation medium to the second end of the second conductor to create a capacitance coupling effect between the first conductor and the second conductor.

7. The wireless terminal device according to claim 5, wherein the second end of the first conductor is directly connected to the second end of the second conductor.

8. The wireless terminal device according to claim 1, wherein the wire body is wrapped with an insulation material.

9. The wireless terminal device according to claim 8, wherein a metal conductive layer is sleeved outside the insulation material of the wire body to shield and ground the wire body.

10. The wireless terminal device according to claim 1, wherein the wire body comprises a Universal Serial Bus line structure.

11. The wireless terminal device according to claim 1, wherein the wire body comprises a flexible printed circuit structure.

12. A wireless terminal device, comprising:
a conduction and connection module;
a first Printed Circuit Board (PCB);
a wire body comprising four signal lines that connect the conduction and connection module and the first PCB; and
a metal spring plate comprising a first foot and a second foot,
wherein the first foot of the metal spring plate is connected to the first PCB through a first insulation material medium to create a capacitance coupling effect between the first PCB and the metal spring plate, and
wherein the second foot of the metal spring plate is connected to the conduction and connection module through a second insulation material medium to create a capacitance coupling effect between the conduction and connection module and the metal spring plate.

13. The wireless terminal device according to claim 12, wherein the first insulation material medium comprises a first lumped capacitance component, and wherein the second insulation material medium comprises a second lumped capacitance component.

14. The wireless terminal device according to claim 12, wherein the wireless terminal device is a wireless network card, and wherein the conduction and connection module is a Universal Serial Bus (USB) converter.

15. The wireless terminal device according to claim 12, wherein the wireless terminal device is a mobile phone, and wherein the conduction and connection module is a second PCB.

16. The wireless terminal device according to claim 12, wherein the four signal lines that connect the conduction and connection module and the first PCB comprise a power supply line, a ground line, a positive differential signal line, and a negative differential signal line.

17. A wireless terminal device, comprising:
a conduction and connection module;
a first Printed Circuit Board (PCB);
a wire body comprising four signal lines that connect the conduction and connection module and the first PCB;
a first conductor comprising a first end and a second end; and
a second conductor comprising a first end and a second end,
wherein the first end of the first conductor is connected to the first PCB through a first insulation material medium and the second end of the first conductor is connected to the first end of the second conductor, and
wherein the second end of the second conductor is connected to the conduction and connection module through a second insulation material medium.

18. The wireless terminal device according to claim 17, wherein the first insulation material medium comprises a first lumped capacitance component, and wherein the second insulation material medium comprises a second lumped capacitance component.

19. The wireless terminal device according to claim 17, wherein the second end of the first conductor is directly connected to the first end of the second conductor.

20. The wireless terminal device according to claim 17, wherein the second end of the first conductor is connected to the first end of the second conductor through a third insulation material medium to create a capacitance coupling effect between the first conductor and the second conductor.

21. The wireless terminal device according to claim 17, wherein the four signal lines that connect the conduction and connection module and the first PCB comprise a power supply line, a ground line, a positive differential signal line, and a negative differential signal line.

* * * * *